United States Patent [19]

Hiraki et al.

[11] Patent Number: 4,521,256

[45] Date of Patent: Jun. 4, 1985

[54] METHOD OF MAKING INTEGRATED DEVICES HAVING LONG AND SHORT MINORITY CARRIER LIFETIMES

[75] Inventors: Shunichi Hiraki, Hiratsuka; Hiroshi Kinoshita, Yokohama; Kuniaki Kumamaru; Shigeo Koguchi, both of Kitakyushu; Toshio Yonezawa, Yokosuka, all of Japan

[73] Assignee: Tokyo Shibaura Denki Kabushiki Kaisha, Japan

[21] Appl. No.: 531,620

[22] Filed: Sep. 13, 1983

[30] Foreign Application Priority Data

Sep. 16, 1982 [JP] Japan .................................. 57-161243

[51] Int. Cl.³ ...................... H01L 21/265; H01L 7/00
[52] U.S. Cl. .................................... 148/1.5; 29/576 B; 29/576 T; 148/187; 148/DIG. 24; 148/DIG. 46; 148/DIG. 81
[58] Field of Search ............... 148/1.5, 187; 29/576 B, 29/576 T; 357/91

[56] References Cited

U.S. PATENT DOCUMENTS

| | | | |
|---|---|---|---|
| 4,047,976 | 9/1977 | Bledsoe et al. | 148/1.5 |
| 4,230,791 | 10/1980 | Chu et al. | 430/296 |
| 4,240,844 | 12/1980 | Felice et al. | 148/1.5 |
| 4,249,962 | 2/1981 | Celler | 148/1.5 |
| 4,318,750 | 3/1982 | Rai-Choudhary et al. | 148/1.5 |
| 4,328,610 | 5/1982 | Thompson et al. | 148/1.5 |
| 4,332,627 | 6/1982 | Schmitt et al. | 148/1.5 |
| 4,392,893 | 7/1983 | Du et al. | 148/1.5 |
| 4,415,373 | 11/1983 | Pressley | 29/576 B |

FOREIGN PATENT DOCUMENTS

| | | | |
|---|---|---|---|
| 150239 | 11/1980 | Japan | 29/576 B |
| 2070328 | 9/1981 | United Kingdom | 29/576 B |

OTHER PUBLICATIONS

Campisano et al, Solid State Electronics, 21, 1978, 485-488.

*Primary Examiner*—Upendra Roy
*Attorney, Agent, or Firm*—Finnegan, Henderson, Farabow, Garrett & Dunner

[57] ABSTRACT

A process for producing a semiconductor device by which the minority carrier lifetime can be selectively changed in a semiconductor device. A radiation beam is irradiated onto the surface of a semiconductor substrate to shorten the minority carrier lifetime. Then ions are selectively implanted into a region in which the minority carrier lifetime is to be recovered. Finally, the resultant structure is annealed.

7 Claims, 5 Drawing Figures

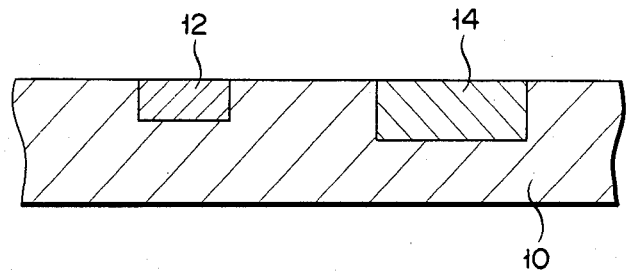
F I G. 1
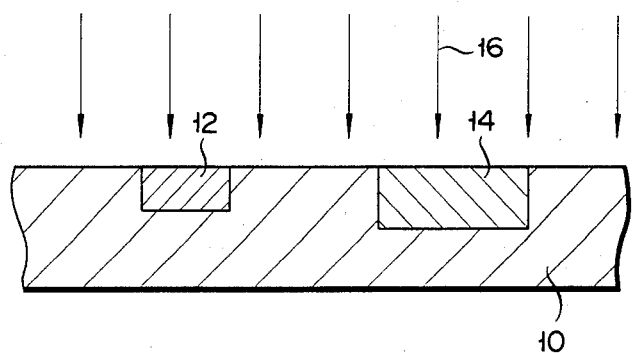
F I G. 2
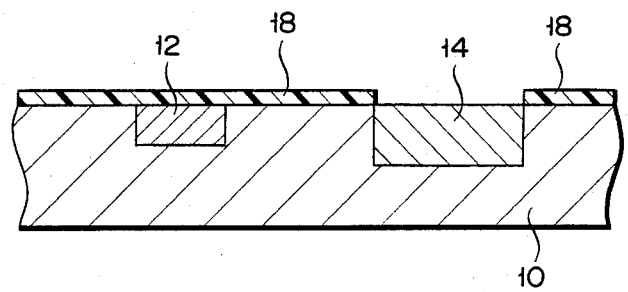
F I G. 3
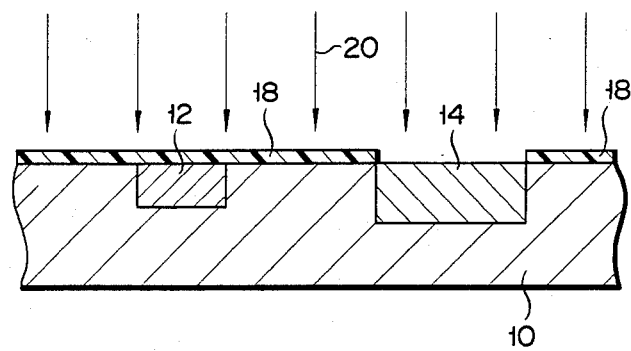
F I G. 4

METHOD OF MAKING INTEGRATED DEVICES HAVING LONG AND SHORT MINORITY CARRIER LIFETIMES

BACKGROUND OF THE INVENTION

1. Field of the Invention

The present invention relates to a semiconductor device and a process for producing the same.

2. Description of the Prior Art

Conventionally, in order to shorten a minority carrier lifetime in the manufacture of silicon diodes, transistors, and thyristors which require high-speed switching characteristics, either an impurity such as Au is diffused in a semiconductor substrate or an electron beam is irradiated on the semiconductor substrate. The electron beam irradiation technique is frequently used because the process is easy to control. When the semiconductor substrate is irradiated with an electron beam, crystal defects occur therein. The crystal defects serve as recombination sites for capturing the minority carriers, so that the minority carrier lifetime is shortened. The change in the lifetime of the minority carriers due to electron beam irradiation is given by:

$$1/\Delta\tau = 1/\tau - 1/\tau_0 = R\sigma V_{th}\phi = K\phi$$
$$Ne = R\phi \cdot (1/\tau) = \sigma V_{th} Ne \quad \ldots (1)$$

where

- $\tau_0$: the minority carrier lifetime before electron beam irradiation
- $\tau$: the minority carrier lifetime after electron beam irradiation
- R: the introduction ratio of the recombination centers introduced by electron beam irradiation
- $\sigma$: the capture cross section of the recombination center
- $V_{th}$: the thermal carrier velocity
- K: the damage coefficient due to use of the electron beam
- Ne: the recombination center density (cm$^{-2}$)
- $\phi$: the electron beam irradiation dose (cm$^{-2}$)

As is apparent from the above equation, the term $1/\Delta\tau$ can be freely controlled by changing the electron beam irradiation dose $\phi$.

However, electron beam irradiation can only be conventionally performed in units of wafers or chips (semiconductor devices). Therefore, the minority carrier lifetime cannot be selectively controlled within a single semiconductor device.

SUMMARY OF THE INVENTION

It is, therefore, an object of the present invention to provide a process for producing a semiconductor device wherein a minority carrier lifetime can be selectively controlled within a single semiconductor device.

According to the process of the present invention, a radiation beam is irradiated onto a major surface of a semiconductor substrate having at least one p-n junction, so as to shorten the minority carrier lifetime. Thereafter, ions are selectively doped in a region where a longer minority carrier lifetime is to be recovered. The semiconductor substrate is then heated to selectively recover a longer minority carrier lifetime at the doped region.

According to the present invention, the minority carrier lifetime can be selectively and arbitrarily controlled within a single semiconductor device.

BRIEF DESCRIPTION OF THE DRAWINGS

FIGS. 1 to 4 are sectional views for explaining a process of the present invention.

DETAILED DESCRIPTION OF THE PREFERRED EMBODIMENT

Figure 5:
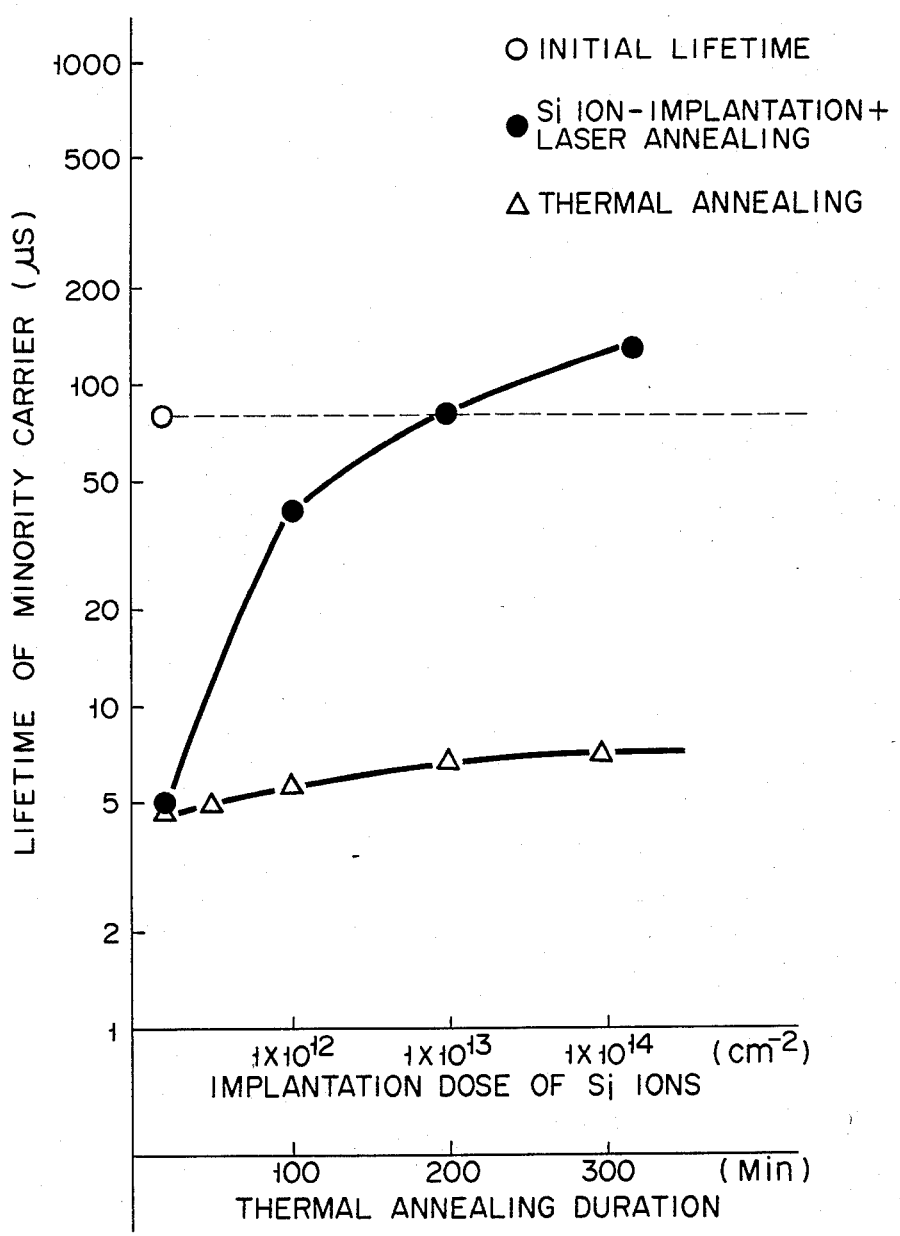
FIG. 5 is a graph showing the recovery mode of the minority carrier lifetime.

A preferred embodiment of the present invention will now be described in detail with reference to the accompanying drawings.

As shown in FIG. 1, a substrate 10 made of a semiconductor material such as silicon and gallium arsenide is prepared. The substrate 10 has a region (referred to hereinafter as a lifetime shortening region) 12 wherein a minority carrier lifetime is to be shortened, in which a bipolar analog circuit, for example, is formed. The substrate 10 also has a region (referred to hereinafter as a lifetime recovery region) 14 in which a longer minority carrier lifetime is to be recovered and a MOS digital circuit, for example, is formed therein.

As shown in FIG. 2, a radiation beam 16 such as an $\alpha$-ray, a $\gamma$-ray, an electron beam, an X-ray, and a neutron beam is used to irradiate the entire surface of the semiconductor substrate 10. By this operation, crystal defects (recombination sites) are formed in the semiconductor substrate, so that minority carriers are captured therein. As a result, the minority carrier lifetime is shortened throughout the entire area of the semiconductor substrate 10. The relation between the irradiation dose and a change in the minority carrier lifetime is given by equation (1). For example, when an electron beam is used to irradiate the substrate 10 having a resistivity $\rho$ of 150 $\Omega$cm and a minority carrier lifetime of 80 $\mu$s at an irradiation energy $E_A = 1.0$ MeV and at a dose $\phi_e = 1 \times 10^{14}$ cm$^{-2}$, the minority carrier lifetime can be greatly shortened to about 5 $\mu$s. The minority carrier lifetime can be arbitrarily controlled in accordance with required types of semiconductor products. In the IC manufacturing process, an electron beam is used to irradiate the substrate normally at a dose of $1 \times 10^{13}$ to $1 \times 10^{14}$ cm$^{-2}$.

Thereafter, as shown in FIG. 3, the surface of the semiconductor substrate, excluding the lifetime recovery region 14, is selectively covered with a mask 18. A preferred mask is a photoresist film, a metal film such as Al, Mo, W or the like, an SiO$_2$ film, or an SiN film. This selective covering may be performed by a well-known photoetching technique such that a mask is first formed to cover the entire surface of the substrate 10, and is then selectively etched at the portion which covers the lifetime recovery region 14.

As shown in FIG. 4, ions 20 are then implanted into the entire surface of the resultant structure. As a result, ions are doped only in the lifetime recovery region 14 which is not covered by the mask 18. Si ions perform best but, if an n or p type conductivity is desired P, B, Al, Ga, As, Sb ions can be doped. When a GaAs semiconductor is used, Si, Zn, or S ions can be implanted. The implanting energy (acceleration voltage) and dose of the ions can be arbitrarily determined in accordance with the depth of the lifetime recovery region 14 and a desired minority carrier lifetime. For example, the implanting energy can be 1 MeV and the dose can be $1 \times 10^{13}$ cm$^{-2}$.

The resultant structure is then thermally annealed. Annealing can be performed by irradiating a laser beam, electron beam, or ion beam, or by using a furnace. A getter site is formed in the ion-implanted portion. As a result, the crystal defects which arose during the radiation beam irradiation are absorbed by the getter site and disappear, and thereby the minority carrier lifetime is recovered. The degree of thermal annealing can be arbitrarily selected in accordance with the desired lifetime. Therefore, by regulating the ion doping dose and the annealing conditions, the recovered minority carrier lifetime in the lifetime recovery region 14 can be completely controlled.

Through the process described above, a lifetime recovery region can be formed in the lifetime-shortened semiconductor substrate. The mask 18 can be removed any time after ion implantation is performed.

EXAMPLE

An electron beam was used to irradiate a semiconductor substrate having a resistivity of 150 Ωcm, at an irradiation energy of 1.0 MeV and at a dose $\phi_e$ of $1 \times 10^{14}$ cm$^{-2}$. Si ions were doped at an acceleration voltage of 1 MeV varying ion implanting dose levels. Laser annealing was then performed using a 20-kHz, 10-W YAG laser (CW) having a scanning velocity of 0.8 cm/sec. The results obtained on the relationship between the Si ion implanting dose and the minority carrier lifetime are illustrated in FIG. 5.

Meanwhile, an electron beam was used to irradiate a semiconductor substrate having a resistivity of 150 Ωcm, at an irradiation energy of 1.0 MeV and at a dose $\phi_e$ of $1 \times 10^{14}$ cm$^{-2}$. The resultant structure was thermally annealed at a temperature of 300° C. The relationship between the annealing time and the minority carrier lifetime was tested. The results are also shown in FIG. 5.

As is apparent from FIG. 5, it was found that the minority carrier lifetime can be completely recovered by Si ion implantation. Conversely, when ion implantation is not performed, the minority carrier lifetime cannot be substantially recovered, even if annealing is performed.

According to the process of the present invention described above, the minority carrier lifetime can be selectively and arbitrarily controlled within a single semiconductor device. Therefore, when the process of the present invention is applied to manufacture of a semiconductor device having both a MOS digital circuit and a bipolar analog circuit, the MOS digital circuit can be formed in a region having a long minority carrier lifetime so as to improve the frequency characteristics, and the bipolar analog circuit can be formed in a region having a short minority carrier lifetime so as to improve the switching characteristics. Furthermore, such problems as soft error caused by α-rays, and erroneous memory operation caused by minority carriers generated by impact ionization have recently occurred in MOSLSI. However, these problems can be solved by the process of the present invention. In a charge-coupled device image sensor, noise caused by light leakage (called a light leakage phenomenon) from a portion excluding a light-receiving portion, and clock noise from minority carriers electrically injected from a peripheral circuit can be eliminated. Furthermore, spectral and resolution characteristics can be improved. In addition to the above advantages, the present invention can be applied to prevent the latch-up phenomenon in a CMOS device.

What is claimed is:

1. A process for producing a semiconductor device, comprising the steps of:
    irradiating with a radiation beam the entire surface of a semiconductor substrate having a p-n junction, thereby shortening a minority carrier lifetime;
    selectively implanting ions in a region wherein the minority carrier lifetime is to be recovered; and
    annealing the resultant structure.

2. The process according to claim 1, wherein said semiconductor substrate is made of silicon.

3. The process according to claim 1, wherein said semiconductor substrate is made of gallium arsenide.

4. The process according to claim 1, wherein the step of annealing the resultant structure is performed using a laser beam, an electron beam, or an ion beam.

5. The process according to claim 2, wherein said ions are ions selected from the group consisting of silicon, boron, aluminum, gallium, arsenic, phosphorus and antimony ions.

6. The process according to claim 3, wherein said ions are ions selected from the group consisting of silicon, zinc and sulfur ions.

7. A process for producing a semiconductor device, comprising the steps of:
    irradiating with a radiation beam the entire surface of a semiconductor substrate having a p-n junction, thereby shortening a minority carrier lifetime;
    selectively implanting silicon ions in a region wherein the minority carrier lifetime is to be recovered; and
    annealing the resultant structure.

* * * * *